United States Patent
Hatakeyama et al.

(10) Patent No.: US 11,390,525 B2
(45) Date of Patent: Jul. 19, 2022

(54) CARBON NANOTUBE AGGREGATE COMPRISING A NON-ALIGNED PORTION

(71) Applicant: NITTO DENKO CORPORATION, Ibaraki (JP)

(72) Inventors: Yoshiharu Hatakeyama, Ibaraki (JP); Tomoaki Ichikawa, Ibaraki (JP); Shotaro Masuda, Ibaraki (JP); Yohei Maeno, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 76 days.

(21) Appl. No.: 16/338,810

(22) PCT Filed: Aug. 8, 2017

(86) PCT No.: PCT/JP2017/028733
§ 371 (c)(1),
(2) Date: Apr. 2, 2019

(87) PCT Pub. No.: WO2018/066222
PCT Pub. Date: Apr. 12, 2018

(65) Prior Publication Data
US 2020/0048093 A1 Feb. 13, 2020

(30) Foreign Application Priority Data
Oct. 3, 2016 (JP) ............... JP2016-195769

(51) Int. Cl.
*B32B 5/04* (2006.01)
*B32B 5/14* (2006.01)
(Continued)

(52) U.S. Cl.
CPC ...... *C01B 32/158* (2017.08); *H01L 21/68757* (2013.01); *B82Y 30/00* (2013.01)

(58) Field of Classification Search
CPC ............... C01B 32/158; C01B 32/162
See application file for complete search history.

(56) References Cited

U.S. PATENT DOCUMENTS 8,900,701 B2  12/2014  Maeno et al.
9,809,458 B2  11/2017  Kim et al.
(Continued)

FOREIGN PATENT DOCUMENTS

CN  101678970 A  3/2010
CN  102007071 A  4/2011
(Continued)

OTHER PUBLICATIONS

HU et al., Compressed carbon nanotubes: A family of new multifunctional carbon allotropes, Scientific Reports | 3 : 1331 | DOI: 10.1038/srep01331 (Year: 2013).*
(Continued)

*Primary Examiner* — Hoa (Holly) Le
(74) *Attorney, Agent, or Firm* — Sughrue Mion, PLLC

(57) ABSTRACT

Provided is a carbon nanotube aggregate excellent in gripping force in a wide temperature range including high-temperature conditions. The carbon nanotube aggregate of the present invention is a carbon nanotube aggregate of a sheet shape, including a plurality of carbon nanotubes, wherein the carbon nanotube aggregate satisfies the following condition for FFM differential voltages when a frictional curve is obtained by scanning a front surface and/or a back surface of the carbon nanotube aggregate with a probe of a scanning probe microscope under a state in which the probe is brought into contact therewith: a ratio of an FFM differential voltage at 210° C. to an FFM differential voltage at 25° C. is from 0.3 to 5.

6 Claims, 4 Drawing Sheets

(51) Int. Cl.
*C01B 32/158* (2017.01)
*H01L 21/687* (2006.01)
*B82Y 30/00* (2011.01)

(56) References Cited

U.S. PATENT DOCUMENTS

| | | | |
|---|---|---|---|
| 9,956,546 B2 | | 5/2018 | Kim et al. |
| 2009/0001326 A1 | * | 1/2009 | Sato ............... B82Y 40/00 252/511 |
| 2010/0301278 A1 | * | 12/2010 | Hirai ............... C01B 32/15 252/502 |
| 2011/0039095 A1 | | 2/2011 | Maeno et al. |
| 2013/0244019 A1 | | 9/2013 | Hata et al. |
| 2015/0273441 A1 | * | 10/2015 | Kim ............... B01J 21/185 428/402 |
| 2015/0274529 A1 | | 10/2015 | Kim et al. |
| 2015/0298974 A1 | | 10/2015 | Kim et al. |
| 2017/0271193 A1 | * | 9/2017 | Maeno ............... B82B 1/00 |
| 2018/0222038 A1 | | 8/2018 | Maeno et al. |
| 2019/0177165 A1 | * | 6/2019 | Hatakeyama ......... C01B 32/162 |
| 2020/0039826 A1 | * | 2/2020 | Hatakeyama ......... C01B 32/162 |
| 2020/0048093 A1 | | 2/2020 | Hatakeyama et al. |

FOREIGN PATENT DOCUMENTS

| | | | |
|---|---|---|---|
| CN | 103068730 A | | 4/2013 |
| CN | 109562945 A | | 4/2019 |
| EP | 2 269 951 A1 | | 1/2011 |
| JP | 2001-351961 A | | 12/2001 |
| JP | 2010-254572 A | | 11/2010 |
| JP | 2013-138152 A | | 7/2013 |
| JP | 2014098107 A | * | 5/2014 |
| JP | 2016-501813 A | | 1/2016 |
| JP | 2016-046520 A | | 4/2016 |
| JP | 2017-035743 A | | 2/2017 |
| JP | 2017-094412 A | | 6/2017 |
| KR | 10-2010-0029122 A | | 3/2010 |
| TW | 201613027 A | | 4/2016 |
| WO | 2008/152940 A1 | | 12/2008 |
| WO | 2012/018117 A1 | | 2/2012 |
| WO | 2016027803 A1 | | 2/2016 |
| WO | 2017/026336 A1 | | 2/2017 |
| WO | WO-2017159661 A1 | * | 9/2017 ............ B65G 49/07 |

OTHER PUBLICATIONS

Extended European Search Report dated Apr. 14, 2020 from European Patent Office in EP Application No. 17858062.7.
Ler, J. G. Q, et al., "Effect of sidewall modification in the determination of friction coefficient of vertically aligned carbon nanotube films using friction force microscopy", Carbon, 2007 pp. 2737-2743, vol. 45.
International Search Report of PCT/JP2017/028733 dated Oct. 31, 2017 [PCT/ISA/210].
Office Action dated Jan. 13, 2021, from the Taiwanese Intellectual Property Office in application No. 106132010.
Written Patent Opposition dated Jun. 8, 2021 and mailed Jun. 30, 2021 in Japanese Patent No. 6796984.
Carpick et al., "Lateral stiffness: A new nanomechanical measurement for the determination of shear strengths with friction force microscopy", Applied Physics Letters, 1997, vol. 70, Issue 12, pp. 1548-1550 (7 pages total).
Jeong et al., "Evaluation of Elastic Properties and Temperature Effects in Si Thin Films Using an Electrostatic Microresonator", Journal of Microelectromechanical Systems, 2003, vol. 12, No. 4, pp. 524-530 (9 pages total).
First Office Action dated Feb. 22, 2022 by The State Intellectual Property Office of People's Republic of China in Chinese Application No. 201780061338.X.
Liangti Qu et al., "Carbon Nanotube Arrays with Strong Shear Binding-On and Easy Normal Lifting-Off", Science, Oct. 10, 2008, vol. 322, pp. 238-242 (30 pages total).

* cited by examiner

CARBON NANOTUBE AGGREGATE COMPRISING A NON-ALIGNED PORTION

CROSS REFERENCE TO RELATED APPLICATIONS

This application is a National Stage of International Application No. PCT/JP2017/028733, filed Aug. 8, 2017, claiming priority to Japanese Patent Application No. 2016-195769, filed Oct. 3, 2016.

TECHNICAL FIELD

The present invention relates to a carbon nanotube aggregate.

BACKGROUND ART

In transporting an object to be processed, such as a material, a production intermediate, or a product, in a manufacturing process for a semiconductor device or the like, the object to be processed is transported through use of a carrying member, such as a movable arm or a movable table (see, for example, Patent Literatures 1 and 2). In such transportation, there is a demand for a member on which the object to be processed is to be mounted (fixing jig for transportation) to have such a strong gripping force as to prevent the object to be processed from shifting in position while being transported. In addition, such demand has increased year by year along with a demand for a faster manufacturing process.

However, a conventional fixing jig for transportation holds the object to be processed with an elastic material, such as a resin, and hence involves a problem in that the elastic material is liable to adhere to and remain on the object to be processed. In addition, the elastic material, such as a resin, involves a problem in that its physical properties, such as hardness, largely vary depending on temperature, and hence it is difficult for the material to maintain the same level of gripping force in a wide temperature range.

When a material such as ceramics is used for the fixing jig for transportation, contamination of the object to be processed is prevented, and temperature dependence of a gripping force is reduced. However, a fixing jig for transportation formed of such material involves a problem of inherently having a weak gripping force, and thus being unable to sufficiently hold the object to be processed even at normal temperature.

CITATION LIST

Patent Literature

[PTL 1] JP 2001-351961 A
[PTL 2] JP 2013-138152 A

SUMMARY OF INVENTION

Technical Problem

An object of the present invention is to provide a carbon nanotube aggregate excellent in gripping force in a wide temperature range including high-temperature conditions.

Solution to Problem

According to one embodiment of the present invention, there is provided a carbon nanotube aggregate of a sheet shape, including a plurality of carbon nanotubes, wherein the carbon nanotube aggregate satisfies the following condition for friction force microscope (FFM) differential voltages when a frictional curve is obtained by scanning a front surface and/or a back surface of the carbon nanotube aggregate with a probe of a scanning probe microscope under a state in which the probe is brought into contact therewith: a ratio of an FFM differential voltage at 210° C. to an FFM differential voltage at 25° C. is from 0.3 to 5.

In one embodiment, the carbon nanotube aggregate satisfies the following condition for the FFM differential voltages: a ratio of an FFM differential voltage at 300° C. to the FFM differential voltage at 25° C. is from 0.3 to 5.

In one embodiment, the carbon nanotube aggregate is used for a fixing jig for transportation.

Advantageous Effects of Invention

According to the present invention, the carbon nanotube aggregate excellent in gripping force in a wide temperature range including high-temperature conditions can be provided.

DESCRIPTION OF EMBODIMENTS

A. Carbon Nanotube Aggregate

Figure 1:
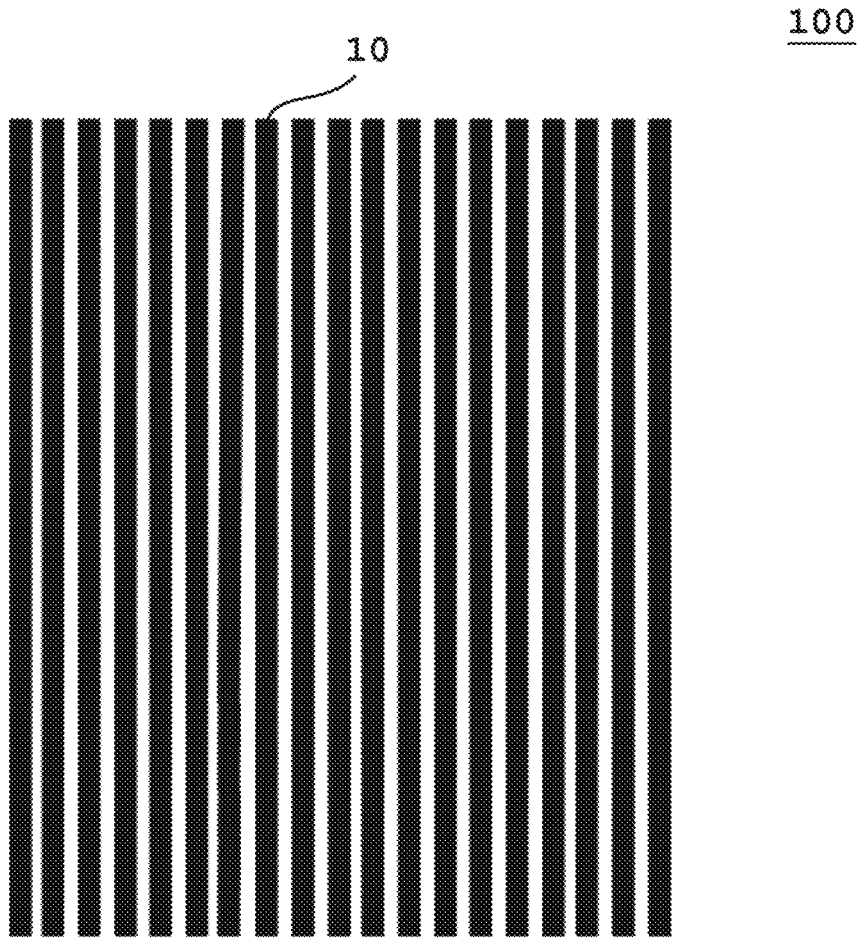
FIG. 1 is a schematic sectional view of a carbon nanotube aggregate according to one embodiment of the present invention.

FIG. 1 is a schematic sectional view for schematically illustrating part of a carbon nanotube aggregate according to one embodiment of the present invention. A carbon nanotube aggregate 100 includes a plurality of carbon nanotubes 10. The carbon nanotubes 10 are aligned in a substantially vertical direction relative to a predetermined plane (e.g., one surface of the carbon nanotube aggregate defined in the end portions of the plurality of carbon nanotubes). The term "substantially vertical direction" as used herein means that an angle relative to the predetermined plane is preferably 90°±20°, more preferably 90°±15°, still more preferably 90°±10°, particularly preferably 90°±5°.

The carbon nanotube aggregate of the present invention includes an inorganic material, and hence its surface state hardly changes depending on temperature. When such carbon nanotube aggregate is applied to a fixing jig for transportation, the fixing jig for transportation can exhibit the same level of excellent holding strength under a low-temperature environment and under a high-temperature environment. In addition, the carbon nanotube aggregate of the present invention does not contaminate any object to be transported even under high temperature, and is hence particularly suitable for the transportation of an object to be transported requiring high cleanliness (e.g., a semiconductor wafer).

The carbon nanotube aggregate of the present invention satisfies the following condition for FFM differential voltages when a frictional curve is obtained by scanning the front surface and/or back surface of the carbon nanotube aggregate (a surface on the upper side of the drawing sheet and/or a surface on the lower side of the drawing sheet in FIG. 1) with the probe of a scanning probe microscope under a state in which the probe is brought into contact therewith: the ratio (FFM differential voltage at 210° C./FFM differential voltage at 25° C.) of an FFM differential voltage at 210° C. to an FFM differential voltage at 25° C. is from 0.3 to 5. In one embodiment, an FFM differential voltage at 210° C. measured under a vacuum (gas pressure: $1\times10^{-4}$ Pa or less) and an FFM differential voltage at 25° C. measured under an atmospheric pressure satisfy the range.

The scanning probe microscope to be used in the measurement of the FFM differential voltages (the obtainment of the frictional curve) includes a tipless cantilever. The FFM differential voltages are measured by: bringing the probe into contact with the front surface and/or back surface of the carbon nanotube aggregate (hereinafter sometimes referred to as "measurement surface"); scanning the measurement surface with the probe in a direction vertical to the lengthwise direction of the cantilever; and electrically detecting the distortion amount of the cantilever. In the measurement, a material for the probe is Si, the length of the cantilever is 450 μm±10 μm, a spring constant Ct of the deflection of the cantilever is from 0.02 N/m to 0.77 N/m, a vertical displacement (deflection amount) to be loaded to the front end of the cantilever is −1.0 nm, a scan length is 10 μm, and a scan frequency is 0.5 Hz. In addition, the distortion amount of the cantilever is detected by an optical lever system. For example, a product available under the product name "AFM5300E/NanoNavi II" from Hitachi High-Tech Science Corporation is used in the measurement of the FFM differential voltages.

The FFM differential voltages and the frictional force of the measurement surface have the relationship "frictional force (N)=spring constant Ct (N/m)/distortion sensitivity $S_{FFM}\times$FFM differential voltage (mV)$\times 10^{-9}$." In the present invention, the use of the carbon nanotube aggregate can provide a fixing jig for transportation that shows a small change in frictional force in a wide variety of temperature environments including a high-temperature environment, and hence can strongly hold an object to be transported.

For the FFM differential voltages, the ratio of the FFM differential voltage at 210° C. to the FFM differential voltage at 25° C. is preferably from 0.4 to 3, more preferably from 0.6 to 2.5, particularly preferably from 0.8 to 2. When the ratio falls within such range, the effects of the present invention become more significant. In one embodiment, the FFM differential voltage at 210° C. measured under a vacuum (gas pressure: $1\times10^{-4}$ Pa or less) and the FFM differential voltage at 25° C. measured under an atmospheric pressure satisfy the range.

For the FFM differential voltages, the ratio (FFM differential voltage at 300° C./FFM differential voltage at 25° C.) of the FFM differential voltage at 300° C. to the FFM differential voltage at 25° C. is preferably from 0.3 to 5, more preferably from 0.4 to 4, still more preferably from 0.6 to 3, particularly preferably from 0.8 to 2.5. When the ratio falls within such range, the effects of the present invention become more significant. In one embodiment, the FFM differential voltage at 300° C. measured under a vacuum (gas pressure: $1\times10^{-4}$ Pa or less) and the FFM differential voltage at 25° C. measured under an atmospheric pressure satisfy the range.

For the FFM differential voltages, the FFM differential voltage at 25° C. is preferably from 0.001 mV to 20 mV, more preferably from 0.001 mV to 5 mV, still more preferably from 0.001 mV to 0.2 mV, particularly preferably from 0.01 mV to 0.1 mV.

For the FFM differential voltages, the FFM differential voltage at 210° C. is preferably from 0.001 mV to 20 mV, more preferably from 0.001 mV to 5 mV, still more preferably from 0.0003 mV to 1 mV, particularly preferably from 0.03 mV to 0.5 mV. In one embodiment, the FFM differential voltage at 210° C. measured under a vacuum (gas pressure: $1\times10^{-4}$ Pa or less) satisfies the range.

For the FFM differential voltages, the FFM differential voltage at 300° C. is preferably from 0.001 mV to 20 mV, more preferably from 0.001 mV to 5 mV, still more preferably from 0.0003 mV to 1 mV, particularly preferably from 0.03 mV to 0.5 mV. In one embodiment, the FFM differential voltage at 300° C. measured under a vacuum (gas pressure: $1\times10^{-4}$ Pa or less) satisfies the range.

Figure 2:
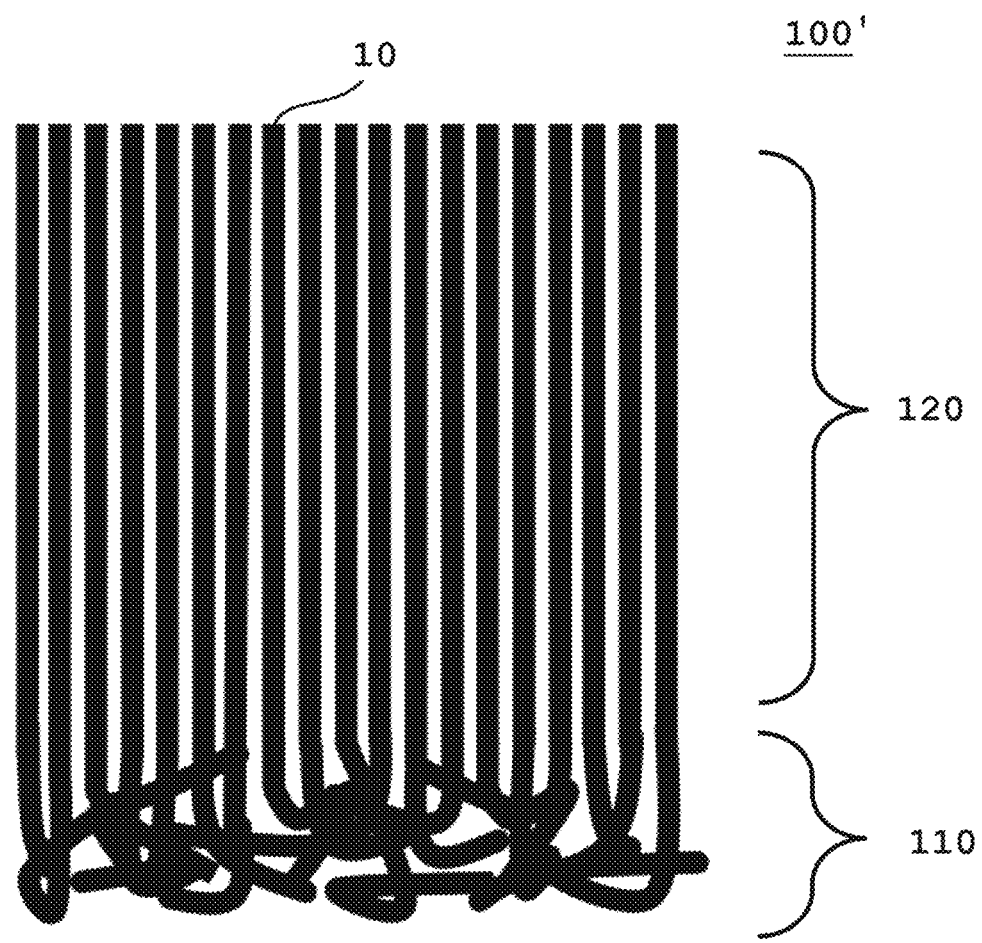
FIG. 2 is a schematic sectional view of a carbon nanotube aggregate according to another embodiment of the present invention.

FIG. 2 is a schematic sectional view for schematically illustrating part of a carbon nanotube aggregate according to another embodiment of the present invention. In this embodiment, the carbon nanotube aggregate 100 has a non-aligned portion 110 of the carbon nanotubes 10. In one embodiment, as illustrated in FIG. 2, the carbon nanotube aggregate 100 further includes an aligned portion 120 of the carbon nanotubes 10. The aligned portion 120 of the carbon nanotubes 10 is aligned in a substantially vertical direction relative to a predetermined plane (e.g., one surface of the carbon nanotube aggregate defined in the end portions of the plurality of carbon nanotubes). When the carbon nanotube aggregate includes the non-aligned portion of the carbon nanotubes, connection in the surface directions of the carbon nanotubes is strengthened. As a result, the carbon nanotube aggregate can be formed into a sheet shape.

In one embodiment, the non-aligned portion 110 of the carbon nanotubes 10 is present near an end portion in the lengthwise direction of the carbon nanotube aggregate 100. In FIG. 2, the non-aligned portion 110 is formed at one end of the carbon nanotube aggregate 100. The position of the non-aligned portion is not limited to the example illustrated in FIG. 2, and the non-aligned portions of the carbon nanotubes may be present near both end portions in the lengthwise direction of the carbon nanotube aggregate. In addition, the non-aligned portion of the carbon nanotubes may be present near the intermediate portion of the carbon nanotube aggregate. Further, the carbon nanotube aggregate may include a plurality of non-aligned portions or aligned portions of the carbon nanotubes.

Herein, the non-aligned portion of the carbon nanotubes means an aggregate portion including such carbon nanotubes that the standard deviation value of their alignment angles is 40° or more. The standard deviation value of the alignment angles of the carbon nanotubes is determined as described below.

Figure 3:
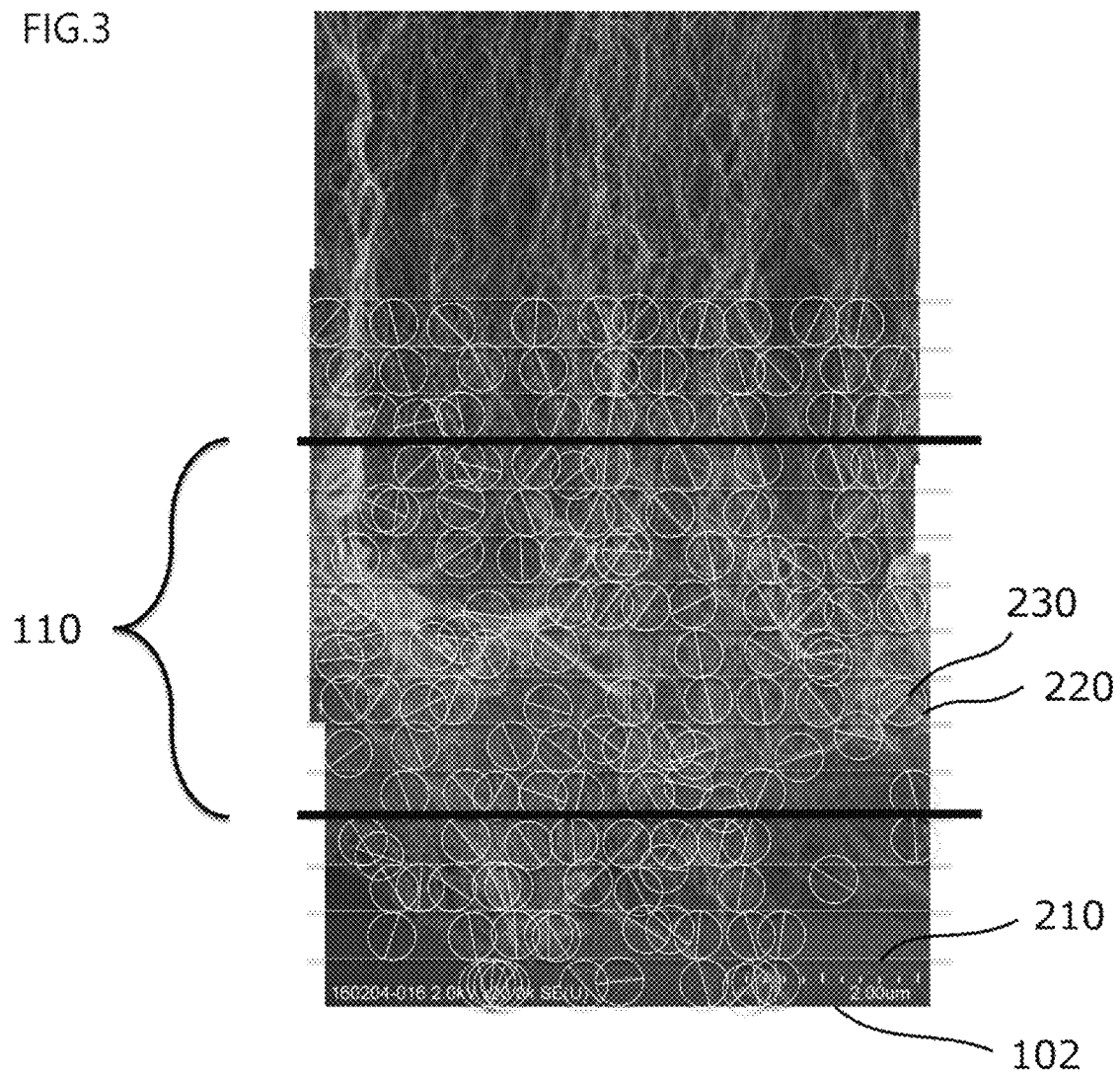
FIG. 3 is a SEM image of the carbon nanotube aggregate according to one embodiment of the present invention.

(1) A SEM image (magnification: 20,000, image range: the thickness of the carbon nanotube aggregate×a width of about 6 μm) of a section of the carbon nanotube aggregate is acquired. FIG. 3 is the SEM image, and a side closer to a lower surface 102 of the carbon nanotube aggregate is shown.

(2) Surfaces which are defined in the end portions of a plurality of carbon nanotubes near both end portions in the thickness direction of the carbon nanotube aggregate and in each of which 10 or more carbon nanotubes are present in the widthwise direction of the aggregate are defined as an upper surface and the lower surface 102. In one embodiment, the standard deviation value of the alignment angles of the carbon nanotubes may be measured after the formation of the carbon nanotube aggregate on a base material and before the collection of the carbon nanotube aggregate from the base material. At this time, the lower surface of the carbon nanotube aggregate is a surface substantially parallel to the base material.

(3) Lines 210 parallel to the lower surface 102 are drawn from the lower surface 102 every 500 nm to set divisions at intervals of 500 nm. In FIG. 3, a state in which up to 15 lines are drawn (state in which 15 divisions are set) is shown.

(4) In one division, 10 carbon nanotubes are selected at random.

(5) For each selected carbon nanotube, a circle 220 including the carbon nanotube is set. At this time, the circle 220 is set so that a straight line 230 connecting the two end portions of the carbon nanotube in contact with the circle may have a length of 500 nm±50 nm in the division.

(6) The alignment angle of the straight line 230 relative to the lower surface 102 is measured, and the standard deviation of the alignment angles is determined from the angles of the 10 carbon nanotubes in the division.

(7) When the standard deviation of the alignment angles is 40° or more, it is judged that the carbon nanotubes in the division are not aligned, and hence the division is the non-aligned portion 110 of the carbon nanotubes. In FIG. 3, the thickness of the non-aligned portion 110 is 4 μm. The non-aligned portion of the carbon nanotubes is hereinafter sometimes simply referred to as "non-aligned portion".

Herein, the aligned portion of the carbon nanotubes means an aggregate portion including such carbon nanotubes that the standard deviation value of their alignment angles is less than 40°. That is, the standard deviation of the alignment angles of the carbon nanotubes is determined for each predetermined division as described above, and when the standard deviation is less than 40°, it is judged that the carbon nanotubes in the division are aligned, and hence the division is the aligned portion of the carbon nanotubes. The aligned portion of the carbon nanotubes is hereinafter sometimes simply referred to as "aligned portion".

Figure 4:
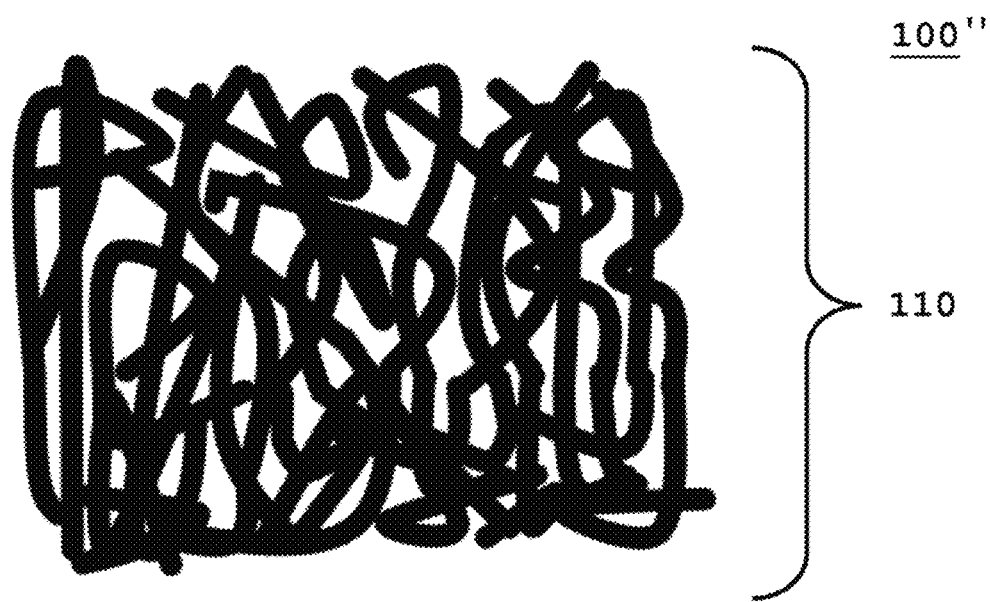
FIG. 4 is a schematic sectional view of a carbon nanotube aggregate according to another embodiment of the present invention.

FIG. 4 is a schematic sectional view for schematically illustrating a carbon nanotube aggregate according to another embodiment of the present invention. In the embodiment illustrated in FIG. 4, a carbon nanotube aggregate 100' is free of the aligned portion 120 of the carbon nanotubes, and includes the non-aligned portion 110 of the carbon nanotubes in its entirety.

In the carbon nanotube aggregate including the aligned portion and the non-aligned portion, the thickness of the non-aligned portion is preferably from 1 μm to 20 μm, more preferably from 2 μm to 10 μm, still more preferably from 2 μm to 7 μm. When the thickness falls within such range, a carbon nanotube aggregate that can maintain a sheet shape can be obtained.

In the carbon nanotube aggregate including the aligned portion and the non-aligned portion, the ratio of the thickness of the non-aligned portion is preferably from 0.1% to 40%, more preferably from 0.2% to 30%, still more preferably from 0.3% to 20% with respect to the thickness of the carbon nanotube aggregate (the sum of the thickness of the aligned portion and the thickness of the non-aligned portion). When the ratio falls within such range, a carbon nanotube aggregate that can maintain a sheet shape can be obtained.

The thickness of the carbon nanotube aggregate is, for example, from 10 μm to 5,000 μm, preferably from 50 μm to 4,000 μm, more preferably from 100 μm to 3,000 μm, still more preferably from 300 μm to 2,000 μm. The thickness of the carbon nanotube aggregate is, for example, the average of thicknesses measured at 3 points sampled at random in a portion inward from an end portion in the surface direction of the carbon nanotube aggregate by 0.2 mm or more.

The coefficient of static friction of the surface of the carbon nanotube aggregate (surface defined in the end portions of the plurality of carbon nanotubes) against a glass surface at 23° C. is preferably 1.0 or more. The upper limit value of the coefficient of static friction is preferably 50. When the coefficient of static friction falls within such range, a carbon nanotube aggregate excellent in gripping property can be obtained. Needless to say, the carbon nanotube aggregate having a large coefficient of friction against the glass surface can express a strong gripping property also against an object to be mounted (e.g., a semiconductor wafer) including a material except glass. The coefficient of static friction may be measured in conformity with JIS K7125.

In one embodiment, the carbon nanotube aggregate of the present invention may be applied to a fixing jig for transportation. The fixing jig for transportation maybe suitably used in, for example, a manufacturing process for a semiconductor device or a manufacturing process for an optical member. In more detail, in the manufacturing process for a semiconductor device, the fixing jig for transportation may be used for transporting a material, a production intermediate, a product, or the like (specifically, a semiconductor material, a wafer, a chip, a substrate, a ceramic plate, a film, or the like) from one step to another or in a predetermined step. Alternatively, in the manufacturing process for an optical member, the fixing jig for transportation may be used for transporting a glass base material or the like from one step to another or in a predetermined step.

For the carbon nanotubes forming the carbon nanotube aggregate, for example, the following embodiments (a first embodiment and a second embodiment) may be adopted.

In a first embodiment, the carbon nanotube aggregate includes a plurality of carbon nanotubes, in which the carbon nanotubes each have a plurality of walls, the distribution width of the wall number distribution of the carbon nanotubes is 10 walls or more, and the relative frequency of the mode of the wall number distribution is 25% or less. A carbon nanotube aggregate having such configuration is excellent in pressure-sensitive adhesive strength.

In the first embodiment, the distribution width of the wall number distribution of the carbon nanotubes is preferably 10 walls or more, more preferably from 10 walls to 30 walls, still more preferably from 10 walls to 25 walls, particularly preferably from 10 walls to 20 walls. When the distribution width of the wall number distribution of the carbon nanotubes is adjusted to fall within such range, a carbon nanotube aggregate excellent in pressure-sensitive adhesive strength can be obtained. The "distribution width" of the wall number distribution of the carbon nanotubes refers to a difference between the maximum wall number and minimum wall number of the wall numbers of the carbon nanotubes.

The wall number and wall number distribution of the carbon nanotubes may each be measured with any appropriate device. The wall number and wall number distribution of the carbon nanotubes are each preferably measured with a scanning electron microscope (SEM) or a transmission electron microscope (TEM). For example, at least 10, preferably 20 or more carbon nanotubes may be taken out from the carbon nanotube aggregate to evaluate the wall number and the wall number distribution by the measurement with the SEM or the TEM.

In the first embodiment, the maximum wall number of the wall numbers of the carbon nanotubes is preferably from 5 to 30, more preferably from 10 to 30, still more preferably from 15 to 30, particularly preferably from 15 to 25.

In the first embodiment, the minimum wall number of the wall numbers of the carbon nanotubes is preferably from 1 to 10, more preferably from 1 to 5.

In the first embodiment, the relative frequency of the mode of the wall number distribution of the carbon nanotubes is preferably 25% or less, more preferably from 1% to 25%, still more preferably from 5% to 25%, particularly preferably from 10% to 25%, most preferably from 15% to 25%. When the relative frequency of the mode of the wall number distribution of the carbon nanotubes is adjusted to fall within the range, a carbon nanotube aggregate excellent in pressure-sensitive adhesive strength can be obtained.

In the first embodiment, the mode of the wall number distribution of the carbon nanotubes is present at preferably from 2 walls to 10 walls in number, more preferably from 3 walls to 10 walls in number. When the mode of the wall number distribution of the carbon nanotubes is adjusted to fall within the range, a carbon nanotube aggregate excellent in pressure-sensitive adhesive strength can be obtained.

In the first embodiment, regarding the shape of each of the carbon nanotubes, the lateral section of the carbon nanotube only needs to have any appropriate shape. The lateral section is of, for example, a substantially circular shape, an oval shape, or an n-gonal shape (n represents an integer of 3 or more).

In the first embodiment, the diameter of each of the carbon nanotubes is preferably from 0.3 nm to 2,000 nm, more preferably from 1 nm to 1,000 nm, still more preferably from 2 nm to 500 nm. When the diameter of each of the carbon nanotubes is adjusted to fall within the range, a carbon nanotube aggregate excellent in pressure-sensitive adhesive strength can be obtained.

In the first embodiment, the specific surface area and density of each of the carbon nanotubes may be set to any appropriate values.

In a second embodiment, the carbon nanotube aggregate includes a plurality of carbon nanotubes, in which the carbon nanotubes each have a plurality of walls, the mode of the wall number distribution of the carbon nanotubes is present at 10 walls or less in number, and the relative frequency of the mode is 30% or more. A carbon nanotube aggregate having such configuration is excellent in pressure-sensitive adhesive strength.

In the second embodiment, the distribution width of the wall number distribution of the carbon nanotubes is preferably 9 walls or less, more preferably from 1 wall to 9 walls, still more preferably from 2 walls to 8 walls, particularly preferably from 3 walls to 8 walls. When the distribution width of the wall number distribution of the carbon nanotubes is adjusted to fall within such range, a carbon nanotube aggregate excellent in pressure-sensitive adhesive strength can be obtained.

In the second embodiment, the maximum wall number of the wall numbers of the carbon nanotubes is preferably from 1 to 20, more preferably from 2 to 15, still more preferably from 3 to 10.

In the second embodiment, the minimum wall number of the wall numbers of the carbon nanotubes is preferably from 1 to 10, more preferably from 1 to 5.

In the second embodiment, the relative frequency of the mode of the wall number distribution of the carbon nanotubes is preferably 30% or more, more preferably from 30% to 100%, still more preferably from 30% to 90%, particularly preferably from 30% to 80%, most preferably from 30% to 70%.

In the second embodiment, the mode of the wall number distribution of the carbon nanotubes is present at preferably 10 walls or less in number, more preferably from 1 wall to 10 walls in number, still more preferably from 2 walls to 8 walls in number, particularly preferably from 2 walls to 6 walls in number.

In the second embodiment, regarding the shape of each of the carbon nanotubes, the lateral section of the carbon nanotube only needs to have any appropriate shape. The lateral section is of, for example, a substantially circular shape, an oval shape, or an n-gonal shape (n represents an integer of 3 or more).

In the second embodiment, the diameter of each of the carbon nanotubes is preferably from 0.3 nm to 2,000 nm, more preferably from 1 nm to 1,000 nm, still more preferably from 2 nm to 500 nm. When the diameter of each of the carbon nanotubes is adjusted to fall within the range, a carbon nanotube aggregate excellent in pressure-sensitive adhesive strength can be obtained.

In the second embodiment, the specific surface area and density of the carbon nanotubes may be set to any appropriate values.

B. Method of producing Carbon Nanotube Aggregate

Any appropriate method may be adopted as a method of producing the carbon nanotube aggregate.

The method of producing the carbon nanotube aggregate is, for example, a method of producing a carbon nanotube aggregate aligned substantially perpendicularly from a base material by chemical vapor deposition (CVD) involving forming a catalyst layer on the base material and supplying a carbon source under a state in which a catalyst is activated with heat, plasma, or the like to grow the carbon nanotubes.

Any appropriate base material may be adopted as the base material that may be used in the method of producing the carbon nanotube aggregate. The base material is, for example, a material having smoothness and high-temperature heat resistance enough to resist the production of the carbon nanotubes. Examples of such material include: metal oxides, such as quartz glass, zirconia, and alumina; metals, such as silicon (e.g., a silicon wafer), aluminum, and copper; carbides, such as silicon carbide; and nitrides, such as silicon nitride, aluminum nitride, and gallium nitride.

Figure 5:
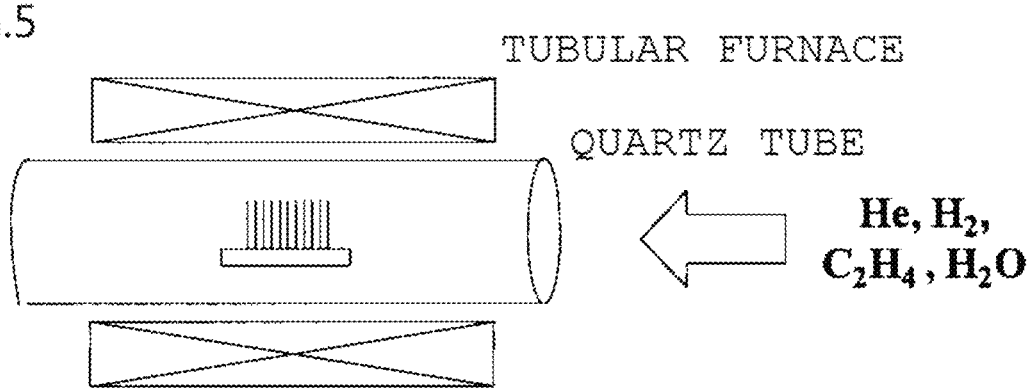
FIG. 5 is a schematic sectional view of a production apparatus for a carbon nanotube aggregate in one embodiment of the present invention.

Any appropriate apparatus may be adopted as an apparatus for producing the carbon nanotube aggregate. The apparatus is, for example, a thermal CVD apparatus of a hot wall type formed by surrounding a cylindrical reaction vessel with a resistance heating electric tubular furnace as illustrated in FIG. 5. In this case, for example, a heat-resistant quartz tube is preferably used as the reaction vessel.

Any appropriate catalyst may be used as the catalyst (material for the catalyst layer) that may be used in the production of the carbon nanotube aggregate. Examples of the catalyst include metal catalysts, such as iron, cobalt, nickel, gold, platinum, silver, and copper.

When the carbon nanotube aggregate is produced, an intermediate layer may be arranged between the base material and the catalyst layer as required. A material forming the intermediate layer is, for example, a metal or a metal oxide. In one embodiment, the intermediate layer includes an alumina/hydrophilic film.

Any appropriate method may be adopted as a method of producing the alumina/hydrophilic film. For example, the film is obtained by producing a $SiO_2$ film on the base material, depositing Al from the vapor, and then increasing the temperature of Al to 450° C. to oxidize Al. According to such production method, $Al_2O_3$ interacts with the hydrophilic $SiO_2$ film, and hence an $Al_2O_3$ surface different from that obtained by directly depositing $Al_2O_3$ from the vapor in particle diameter is formed. When Al is deposited from the vapor, and then its temperature is increased to 450° C. so that Al may be oxidized without the production of any hydrophilic film on the base material, it may be difficult to form the $Al_2O_3$ surface having a different particle diameter. In addition, when the hydrophilic film is produced on the base material and $Al_2O_3$ is directly deposited from the vapor, it may also be difficult to form the $Al_2O_3$ surface having a different particle diameter.

The thickness of the catalyst layer that may be used in the production of the carbon nanotube aggregate is preferably from 0.01 nm to 20 nm, more preferably from 0.1 nm to 10 nm in order to form fine particles. When the thickness of the catalyst layer that may be used in the production of the carbon nanotube aggregate is adjusted to fall within the range, a carbon nanotube aggregate including a non-aligned portion can be formed.

Any appropriate method may be adopted as a method of forming the catalyst layer. Examples of the method include a method involving depositing a metal catalyst from the vapor, for example, with an electron beam (EB) or by sputtering and a method involving applying a suspension of metal catalyst fine particles onto the base material.

Any appropriate carbon source may be used as the carbon source that may be used in the production of the carbon nanotube aggregate. Examples thereof include: hydrocarbons, such as methane, ethylene, acetylene, and benzene; and alcohols, such as methanol and ethanol.

In one embodiment, the cohesive strength may be controlled by the kind of the carbon source to be used. In addition, the formation of the non-aligned portion may be controlled. In one embodiment, the non-aligned portion is formed by using ethylene as the carbon source.

In one embodiment, the carbon source is supplied as a mixed gas together with helium, hydrogen, and water vapor. In one embodiment, the formation of the non-aligned portion may be controlled by the composition of the mixed gas.

Any appropriate temperature may be adopted as a production temperature in the production of the carbon nanotube aggregate. For example, the temperature is preferably from 400° C. to 1,000° C., more preferably from 500° C. to 900° C., still more preferably from 600° C. to 800° C. in order that catalyst particles allowing sufficient expression of the effects of the present invention may be formed.

In one embodiment, the following procedure is followed: as described above, the catalyst layer is formed on the base material, and under a state in which the catalyst is activated, the carbon source is supplied to grow the carbon nanotubes; and then, the supply of the carbon source is stopped, and the carbon nanotubes are maintained at a reaction temperature under a state in which the carbon source is present. In one embodiment, the formation of the non-aligned portion may be controlled by conditions for the reaction temperature-maintaining step.

In one embodiment, the following procedure may be followed: as described above, the catalyst layer is formed on the base material, and under a state in which the catalyst is activated, the carbon source is supplied to grow the carbon nanotubes; and then, a predetermined load is applied in the thickness direction of each of the carbon nanotubes on the base material to compress the carbon nanotubes. According to such procedure, a carbon nanotube aggregate (FIG. 4) formed only of the non-aligned portion of the carbon nanotubes may be obtained. The load is, for example, from 1 $g/cm^2$ to 10,000 $g/cm^2$, preferably from 5 $g/cm^2$ to 1,000 $g/cm^2$, more preferably from 100 $g/cm^2$ to 500 $g/cm^2$. In one embodiment, the ratio of the thickness of the carbon nanotube layer (that is, the carbon nanotube aggregate) after the compression to the thickness of the carbon nanotube layer before the compression is from 10% to 90%, preferably from 20% to 80%, more preferably from 30% to 60%.

The carbon nanotube aggregate is formed on the base material as described above, and then the carbon nanotube aggregate is collected from the base material. Thus, the carbon nanotube aggregate of the present invention is obtained. In the present invention, the non-aligned portion is formed, and hence the carbon nanotube aggregate can be collected while being in a sheet shape formed on the base material.

EXAMPLES

The present invention is described below on the basis of Examples, but the present invention is not limited thereto. Various evaluations and measurements were performed by the following methods. The thickness of a carbon nanotube aggregate was measured by observing a section of the carbon nanotube aggregate with a SEM.

(1) FFM Differential Voltage

An evaluation sample was produced by applying a load of 200 $g/cm^2$ to a predetermined surface of a carbon nanotube aggregate. FFM differential voltages at 25° C. (under an air atmosphere), 210° C. (under a vacuum (gas pressure: $1\times10^{-4}$ Pa or less)), and 300° C. (under a vacuum (gas pressure: $1\times10^{-4}$ Pa or less)) were measured on the predetermined surface of the carbon nanotube aggregate with a product available under the product name "AFM5300E/NanoNavi II" from Hitachi High-Tech Science Corporation. A measurement mode was set to a contact mode, TL-CONT (tipless cantilever, spring constant: 0.2 N/m) was used as a cantilever, and a scan length was set to 10 µm.

(2) Heat Resistance

A silicon wafer (2 cm×2 cm, 0.5 g) and a dead weight of 20 g were arranged on a predetermined surface of the evaluation sample in the stated order, and the resultant laminate was left under the state at 400° C. for 2 hours. After that, the temperature of the laminate was returned to room temperature, and the shape of the evaluation sample and the contamination of the silicon wafer were visually observed. In Table 1, a case in which the shape of the evaluation sample was maintained and the contamination of the silicon wafer was not visually observed was defined as a success (○), and a case in which the shape of the evaluation sample was not maintained or the contamination of the silicon wafer was visually observed was defined as a failure (×).

(3) Transportation Evaluation

A semiconductor wafer made of silicon was fixed onto a stage reciprocating in a linear direction, and an evaluation sample produced in each of Examples and Comparative Example was mounted on the semiconductor wafer made of silicon. At this time, the pressure-sensitive adhesive surface of the evaluation sample was brought into contact with the semiconductor wafer.

Next, a load of 40 g was mounted on the evaluation sample, and the stage was reciprocated 100 times at an acceleration of 0.1 G. The shift amount of the evaluation sample after the reciprocations was measured. In Table 1, a case in which an average shift amount per reciprocation was less than 0.2 mm (or the shift amount after the 100 reciprocations was less than 2 cm) was defined as a success (○).

Example 1

An $Al_2O_3$ thin film (ultimate vacuum: $8.0 \times 10^{-4}$ Pa, sputtering gas: Ar, gas pressure: 0.50 Pa) was formed in an amount of 3,922 ng/cm$^2$ on a silicon base material (manufactured by Valqua FFT Inc., thickness: 700 μm) with a sputtering apparatus (manufactured by Shibaura Mechatronics Corporation, product name: "CFS-4ES"). An Fe thin film was further formed as a catalyst layer (sputtering gas: Ar, gas pressure: 0.75 Pa) in an amount of 294 ng/cm$^2$ on the $Al_2O_3$ thin film with a sputtering apparatus (manufactured by Shibaura Mechatronics Corporation, product name: "CFS-4ES").

After that, the base material was placed in a quartz tube of 30 mmcp, and a helium/hydrogen (105/80 sccm) mixed gas having its moisture content kept at 700 ppm was flowed into the quartz tube for 30 minutes to replace the inside of the tube. After that, the temperature in the tube was increased with an electric tubular furnace to 765° C. and stabilized at 765° C. While the temperature was kept at 765° C., the inside of the tube was filled with a helium/hydrogen/ethylene (105/80/15 sccm, moisture content: 700 ppm) mixed gas, and the resultant was left to stand for 60 minutes to grow carbon nanotubes on the base material.

After that, the raw material gas was stopped, and the inside of the quartz tube was cooled while a helium/hydrogen (105/80 sccm) mixed gas having its moisture content kept at 700 ppm was flowed into the quartz tube.

A carbon nanotube aggregate having a thickness of 1,100 μm was obtained by the foregoing operation. The carbon nanotube aggregate was able to be peeled in a sheet shape from the silicon base material with a pair of tweezers.

The carbon nanotube aggregate of a sheet shape produced on the silicon base material was defined as an evaluation sample (1A). An exposed carbon nanotube aggregate surface in the evaluation sample (1A) (i.e., a surface that had been on an opposite side to the silicon base material at the time of the production of the carbon nanotube aggregate) was subjected to the evaluation described in the section (1). The result is shown in Table 1.

The carbon nanotube aggregate of a sheet shape was peeled from the silicon base material, and a surface that had been on a silicon base material side at the time of the production of the carbon nanotube aggregate was fixed to a glass slide base material via a heat-resistant adhesive. Thus, an evaluation sample (1B) was produced. An exposed carbon nanotube aggregate surface in the evaluation sample (1B) (i.e., the surface that had been on the opposite side to the silicon base material at the time of the production of the carbon nanotube aggregate) was subjected to the evaluation described in the section (2). The result is shown in Table 1.

The carbon nanotube aggregate of a sheet shape was peeled from the silicon base material, and a surface that had been on a silicon base material side at the time of the production of the carbon nanotube aggregate was fixed to an alumina base material via a pressure-sensitive adhesive (pressure-sensitive adhesive on a polyimide base material). Thus, an evaluation sample (1C) was produced. The evaluation described in the section (3) was performed by using an exposed carbon nanotube aggregate surface in the evaluation sample (1C) (i.e., the surface that had been on the opposite side to the silicon base material at the time of the production of the carbon nanotube aggregate) as a pressure-sensitive adhesive surface. The result is shown in Table 1.

Example 2

A carbon nanotube aggregate was produced in the same manner as in Example 1.

The carbon nanotube aggregate of a sheet shape was peeled from the silicon base material, and the surface that had been on the opposite side to the silicon base material at the time of the production of the carbon nanotube aggregate was arranged as it was on the silicon base material. Thus, an evaluation sample (2A) was produced. An exposed carbon nanotube aggregate surface in the evaluation sample (2A) (i.e., the surface that had been on the silicon base material side at the time of the production of the carbon nanotube aggregate) was subjected to the evaluation described in the section (1). The result is shown in Table 1.

The carbon nanotube aggregate of a sheet shape was peeled from the silicon base material, and the surface that had been on the opposite side to the silicon base material at the time of the production of the carbon nanotube aggregate was fixed to a glass slide base material via a heat-resistant adhesive. Thus, an evaluation sample (2B) was produced. An exposed carbon nanotube aggregate surface in the evaluation sample (2B) (i.e., the surface that had been on the silicon base material side at the time of the production of the carbon nanotube aggregate) was subjected to the evaluation described in the section (2). The result is shown in Table 1.

The carbon nanotube aggregate of a sheet shape was peeled from the silicon base material, and the surface that had been on the opposite side to the silicon base material at the time of the production of the carbon nanotube aggregate was fixed to an alumina base material via a pressure-sensitive adhesive (pressure-sensitive adhesive on a polyimide base material). Thus, an evaluation sample (2C) was produced. The evaluation described in the section (3) was performed by using an exposed carbon nanotube aggregate surface in the evaluation sample (2C) (i.e., the surface that had been on the silicon base material side at the time of the production of the carbon nanotube aggregate) as a pressure-sensitive adhesive surface. The result is shown in Table 1.

Example 3

An $Al_2O_3$ thin film (ultimate vacuum: $8.0\times10^{-4}$ Pa, sputtering gas: Ar, gas pressure: 0.50 Pa) was formed in an amount of 3,922 ng/cm² on a silicon base material (manufactured by Valqua FFT Inc., thickness: 700 μm) with a sputtering apparatus (manufactured by Shibaura Mechatronics Corporation, product name: "CFS-4ES"). An Fe thin film was further formed as a catalyst layer (sputtering gas: Ar, gas pressure: 0.75 Pa) in an amount of 294 ng/cm² on the $Al_2O_3$ thin film with a sputtering apparatus (manufactured by Shibaura Mechatronics Corporation, product name: "CFS-4ES").

After that, the base material was placed in a quartz tube of 30 mmφ, and a helium/hydrogen (85/60 sccm) mixed gas having its moisture content kept at 600 ppm was flowed into the quartz tube for 30 minutes to replace the inside of the tube. After that, the temperature in the tube was increased with an electric tubular furnace to 765° C. and stabilized at 765° C. While the temperature was kept at 765° C., the inside of the tube was filled with a helium/hydrogen/acetylene (85/60/5 sccm, moisture content: 600 ppm) mixed gas, and the resultant was left to stand for 60 minutes to grow carbon nanotubes on the base material.

After that, the raw material gas was stopped, and the inside of the quartz tube was cooled while a helium/hydrogen (85/60 sccm) mixed gas having its moisture content kept at 600 ppm was flowed into the quartz tube.

A carbon nanotube aggregate having a thickness of 270 μm was obtained by the foregoing operation. The carbon nanotube aggregate could not be peeled in a sheet shape.

The carbon nanotube aggregate formed on the silicon base material was used as it was as an evaluation sample.

An exposed carbon nanotube aggregate surface in the evaluation sample (i.e., a surface that had been on the opposite side to the silicon base material) was subjected to the evaluations described in the sections (1) and (2). In addition, the evaluation described in the section (3) was performed by using the surface as a pressure-sensitive adhesive surface. The results are shown in Table 1.

Comparative Example 1

A fluorine-based resin was arranged as it was, and the surface of the fluorine-based resin was subjected to the evaluations described in the sections (1) and (2). The results are shown in Table 1.

In addition, an evaluation sample was produced by fixing the fluorine-based resin to a pressure-sensitive adhesive tape (base material: polyimide). The evaluation described in the section (3) was performed by using the surface of the fluorine-based resin as a pressure-sensitive adhesive surface. The result is shown in Table 1.

As is apparent from Table 1, the carbon nanotube aggregate of the present invention shows a small change in surface state with temperature, and hence can be suitably used as a transporting member even under high temperature. In Comparative Example 1, differential voltages under high temperature could not be measured because when the temperature of the evaluation sample was set to high temperature, a gas was produced and it was difficult to maintain the shape of the evaluation sample.

REFERENCE SIGNS LIST 10 carbon nanotube
110 non-aligned portion
120 aligned portion
100, 100' carbon nanotube aggregate

The invention claimed is:
1. A carbon nanotube aggregate of a sheet shape, comprising a plurality of carbon nanotubes,
   the carbon nanotube aggregate includes a non-aligned portion of the carbon nanotubes,
   wherein the thickness of the non-aligned portion is from 1 μm to 20 μm,
   wherein the ratio of a thickness of the non-aligned portion is from 0.1% to 40% with respect to a thickness of the carbon nanotube aggregate, and
   wherein the carbon nanotube aggregate satisfies the following condition for FFM differential voltages when a frictional curve is obtained by scanning a front surface and/or a back surface of the carbon nanotube aggregate with a probe of a scanning probe microscope under a state in which the probe is brought into contact therewith:
   a ratio of an FFM differential voltage at 210° C. to an FFM differential voltage at 25° C. is from 0.3 to 5.
2. The carbon nanotube aggregate according to claim 1, wherein the carbon nanotube aggregate satisfies the following condition for the FFM differential voltages:
   a ratio of an FFM differential voltage at 300° C. to the FFM differential voltage at 25° C. is from 0.3 to 5.
3. The carbon nanotube aggregate according to claim 2, wherein the carbon nanotube aggregate is used for a fixing jig for transportation.
4. The carbon nanotube aggregate according to claim 1, wherein the carbon nanotube aggregate is used for a fixing jig for transportation.
5. The carbon nanotube aggregate according to claim 1, wherein the non-aligned portion of the carbon nanotubes is present near an end portion in the lengthwise direction of the carbon nanotube aggregate.

TABLE 1

| | | Example 1 | Example 2 | Example 3 | Comparative Example 1 |
|---|---|---|---|---|---|
| Ratio between differential voltages | 210° C. (vacuum)/25° C. (air) | 0.82 | 1.14 | 1.67 | Unmeasurable |
| | 300° C. (vacuum)/25° C. (air) | 0.79 | 1.16 | 2.17 | Unmeasurable |
| Heat resistance | | ○ | ○ | ○ | x |
| Transportation evaluation | | ○ | ○ | ○ | ○ |

6. The carbon nanotube aggregate according to claim 1, wherein the non-aligned portion of the carbon nanotubes is present near an intermediate portion of the carbon nanotube aggregate.

* * * * *